(12) United States Patent
Otori et al.

(10) Patent No.: US 6,388,941 B2
(45) Date of Patent: May 14, 2002

(54) SEMICONDUCTOR DEVICE

(75) Inventors: Hiroshi Otori, Mizuho; Hiroki Fujisawa, Sagamihara; Minoru Ebihara, Hachioji; Seiji Narui, Sagamihara; Masanori Isoda, Sayama; Akira Ohta, Ome, all of (JP)

(73) Assignees: Hitachi, Ltd.; Hitachi, ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/903,509

(22) Filed: Jul. 13, 2001

(30) Foreign Application Priority Data

Jul. 13, 2000 (JP) ........................... 2000-212162

(51) Int. Cl.$^7$ ................................. G11C 8/00
(52) U.S. Cl. ............... 365/230.08; 365/200; 365/225.7; 365/189.07; 365/185.09
(58) Field of Search ..................... 365/230.08, 230.03, 365/185.11, 189.07, 189.05, 200, 201, 225.7, 185.09

(56) References Cited

U.S. PATENT DOCUMENTS

| | | | |
|---|---|---|---|
| 5,018,104 A | | 5/1991 | Urai ................... 365/185.09 |
| 5,233,566 A | | 8/1993 | Imamiya et al. ....... 365/185.09 |
| 5,319,599 A | | 6/1994 | Kato ...................... 365/200 |
| 5,325,333 A | * | 6/1994 | Sato ...................... 365/200 |
| 5,487,040 A | * | 1/1996 | Sukegawa et al. ......... 365/200 |
| 5,801,986 A | * | 9/1998 | Matsunoto et al. ...... 365/189.09 |
| 5,991,902 A | * | 11/1999 | Yoshida ................. 714/710 |
| 6,134,179 A | * | 10/2000 | Ooishi ................... 365/233 |
| 6,330,200 B2 | * | 12/2001 | Ooishi ................... 365/201 |

FOREIGN PATENT DOCUMENTS

| | | |
|---|---|---|
| JP | 1-261845 | 10/1989 |
| JP | 3-157897 | 7/1991 |
| JP | 4-328398 | 11/1992 |
| JP | 7-326198 | 12/1995 |
| JP | 8-31196 | 2/1996 |
| JP | 8-255498 | 10/1996 |
| JP | 8-335674 | 12/1996 |
| JP | 1116385 | 1/1999 |

* cited by examiner

*Primary Examiner*—Son L. Mai
*Assistant Examiner*—Gene N. Auduong
(74) *Attorney, Agent, or Firm*—Antonelli, Terry, Stout & Kraus, LLP

(57) ABSTRACT

Relief units (UNITb) each having electrically programmable electric fuses for storing information according to the difference in threshold voltage, and an address comparator are disposed in a second area, and relief units (UNITa) each having laser fuses and an address comparator are disposed in a first area. Both areas are adjacent to each other along an address signal wiring for each comparator, and the address signal wiring is laid out linearly. Even if the electric fuses and the laser fuses are caused to coexist for relief address storage, the difference between by-chip occupied areas due to the difference between their configurations can be adjusted based on the size extending in the direction of the address signal wiring, and an increase in the by-chip occupied area can be restrained to the utmost from a layout viewpoint.

13 Claims, 11 Drawing Sheets

SEMICONDUCTOR DEVICE

BACKGROUND

The present invention relates to a technology of relieving a defect of a memory, and particularly to a semiconductor device capable of relieving defects at a probe test stage of the semiconductor device and after its assembly through the use of both of two types of memory elements different in element structure. The present invention also relates to a technology effective for application to a DRAM (Dynamic Random Access Memory), for example.

Unexamined Patent Publication No. Hei 8(1996)-31196 discloses defective address memory means which utilizes an element M1 and a fuse F1 in combination. Unexamined Patent Publication No. Hei 8(1996)-255498 discloses a first redundant address storage circuit 26 including a laser program circuit 40a, and a second redundant address storage circuit 28 including an electrically programmable circuit 42a. Unexamined Patent Publication No. Hei 7(1995)-326198 discloses the technology of storing a defective cell address in a second defective cell address memory 7 by electrical redundancy when a defect occurs in a first defective cell address memory 5 due to laser redundancy. Unexamined Patent Publication No. Hei 3(1991)-157897 (corresponding U.S. Pat. No. 5,233,566) discloses a fuse 5 corresponding to memory means for storing information used for substitution of an abnormal cell with another by non-electrical means, and an n channel FAMOS which is an EPROM cell transistor corresponding to means for storing information used for substitution with a redundant cell by electrical means. Unexamined Patent Publication No. Hei 1(1989)-261845 (corresponding U.S. Pat. No. 5,018,104) discloses a redundant circuit including a first switch element including a non-volatile memory cell provided with means for avoiding erasure, and a second switch element capable of being reset to a pre-switching state. Unexamined Patent Publication No. Hei 4(1992)-328398 (corresponding U.S. Pat. No. 5,319,599) discloses a redundant circuit including a first switch element comprised of a non-volatile memory cell, and a second switch element comprised of an element capable of freely writing and erasing data of an EPROM or the like. Unexamined Patent Publication No. Hei 11(1999)-16385 discloses a semiconductor memory device including a spare column (row) decoder for polysilicon, and a spare column (row) decoder for UPROM (unerasable PROM). Unexamined Patent Publication No. Hei 8(1996)-335674 discloses a method of trimming a semiconductor device wherein, of a plurality of circuits having different functions or characteristics, disposed between main lines of a semiconductor integrated circuit device, one circuit or two or more circuits are selectively connected to the main lines.

SUMMARY OF THE INVENTION

In a process for manufacturing a memory such as a DRAM or the like, defective bits have been relieved upon a wafer probe test. However, defects might take place newly in its subsequent aging or assembly process. Further, defective bits might be left because a relieving process is improper. It is necessary to allow relieving even after the assembly. Therefore, a discussion has been made of a case in which two types of fuses are mounted and an electric fuse relievable after assembly is used as one of them. As the two types of fuses, may be mentioned, a cutoff type laser fuse, an electrically programmable memory device or element (electric fuse) like an EPROM memory cell.

The present inventors have made a discussion about the mounting of electric fuses on a semiconductor device for the purpose of defect relief. According to the discussion, a by-chip occupied area based on electric fuses, latch circuits attendant on them, etc. becomes greatly larger than a by-chip occupied area based on cutoff type laser fuses, and latch circuits attendant on them. When all is comprised of the electric fuses, an area penalty excessively increases. Therefore, if logic circuit portions subsequent to latch circuits attendant on the cutoff type and electric fuses are dedicated for the respective fuses and made attendant thereon when an attempt is made to utilize the cutoff type and electric fuses in combination, it became evident that the area penalty excessively increased after all. The present inventors have found that when the cutoff type and electric fuses are utilized in combination, it is necessary to reduce a by-chip occupied area using or based on address wirings for supplying address information to the respective fuses and signal wirings for transferring the result of comparison, as small as possible.

The known reference has no described the standpoint that an increase in the by-chip occupied area at the time that both the electric and cutoff type fuses are used, is reduced to the utmost.

An object of the present invention is to reduce an increase in by-chip occupied area due to memory elements different in element or device structure as typified by electric and cutoff type fuses, as small as possible from a layout viewpoint when the memory elements are used to hold address information for relief.

Another object of the present invention is to improve the reliability of long-term data retention when an electric program holds address information for relief.

The above, other objects and novel features of the present invention will become apparent from the description of the present specification and the accompanying drawings.

Summaries of typical ones of the inventions disclosed in the present application will be described in brief as follows:

[1] A semiconductor device has a first memory array unit in which normal memory cell are disposed, and a second memory array unit in which redundant memory cell are disposed. Address information of memory cells to be relieved in the first memory array unit are stored in a plurality of first memory elements and second memory elements different in element structure from one another. A plurality of first comparators respectively compare the address information stored in the first memory elements with signal information on an address signal wiring. A plurality of second comparators compare the address information stored in the second memory elements with signal information on the address signal wiring. A relief control circuit performs control for switching an access to the first memory array unit to an access to the second memory array unit according to the coincidence between the results of comparisons by the first and second comparators. The plurality of first memory elements and first comparators are formed in a first area along the address signal wiring, and the plurality of second memory elements and second comparators are formed in a second area adjacent to the first area.

The first memory elements are, for example, cutoff type fuses (cutoff fuse) which store information according to the presence or absence of cutoff. The second memory elements are, for example, electrically programmable non-volatile memory elements (electric fuses) which store information according to a difference in threshold voltage.

The first area and the second area are allocated along the address signal wiring and they are disposed so as to adjoin each other. Therefore, even if the memory elements different in device structure or circuit configuration are caused to coexist for relief address storage, the difference between by-chip occupied areas due to the difference between their configurations can be adjusted based on the size extending in the direction of the address signal wiring, and an increase in the by-chip occupied area can be restrained to the utmost from a layout viewpoint.

As a desirable form, the address signal wiring may be shared between the first comparators and the second comparators. Since the first comparators and the second comparators may be disposed along the address signal wiring, there is no necessity to separately provide them. Sharing the address signal wiring therebetween allows restraint on an increase in by-chip occupied area.

As a desirable form, the address signal wiring may be provided so as to linearly cross over a portion where the first and second areas are adjacent to each other. If a bent portion is less reduced, then a wiring channel width for the address signal wiring can be made small correspondingly. Even from this point of view, a by-chip occupied area can be restrained from increasing.

If the semiconductor device is equipped with a circuit which generates a program voltage used for programming its threshold voltage when the second memory elements are of electric fuses, then each second memory element may be disposed so as to be closer to the program voltage generating circuit than each first memory element. A voltage wiring for transferring the program voltage to the second memory element can be shortened. Even from this point of view, a by-chip occupied area can be restrained from increasing.

Let's assume a plurality of memory bank configurations with respect to the first memory array unit and the second memory array unit. At this time, the first memory array unit and the second memory array unit are disposed on both sides with the first and second areas interposed therebetween. In other words, memory banks are laid out on both sides with the first and second areas interposed therebetween. The second memory elements inherent in memory banks on the respective sides of the memory banks on both sides are disposed so as to be spaced in two stages in the second area in which the second memory elements like electric fuses relatively large in circuit scale are disposed. On the other hand, the first memory elements inherent in memory banks on the respective sides of the memory banks on both sides are disposed so as to be spaced in three stages in the first area in which the first memory elements like cutoff fuses relatively small in circuit scale are disposed. If the layout of the first memory elements like the cutoff fuses small in circuit scale is brought to high density in a three-stage layout, then an increase in the area occupied by the chip can be restrained even from this point of view.

When a defect corresponding to the full upper limit first takes place with respect to an upper limit relievable by a relief circuit, it is impossible to relieve a new or additional defect developed after its relief. If the first defect is less than the relievable upper limit, it is then possible to relieve the new defect developed after its relief. When consideration is given to an improvement in the efficiency of relieving processing in the former, the execution of relieving processing by the same procedure even if the first defect corresponds or uncorresponds to the full upper limit is efficient. Namely, the number of addresses storable by the first memory elements may be set equal to the upper limit of the number of relief addresses relievable by the second memory array unit. To this end, for example, at least, the number of the first memory elements is greater than that of the second memory elements, and the number of addresses storable by the first and second memory elements is set larger than an upper limit of the number of relief addresses relievable by the second memory array unit, and means which selects the result of comparisons by some first comparators and the result of comparisons by some second comparators may be provided.

[2] The second memory elements like electric fuses for holding relief address information may preferably have high reliability with respect to long-term information retention performance. Each of the second memory elements according to this viewpoint is provided with a non-volatile storage transistor device or element having a first source electrode, a first drain electrode, a floating gate electrode, and a control gate electrode and capable of having different threshold voltages; and a read transistor element having a second source electrode and a second drain electrode, having the floating gate electrode as a gate electrode, and capable of having mutual conductances different according to the threshold voltages held by the non-volatile storage transistor element, and may be configured so as to transmit a signal generated according to the mutual conductance of the read transistor element to transfer means.

When, for example, one threshold voltage of the non-volatile storage transistor element is set to a relatively high threshold voltage (threshold voltage in a write state in which electrons are injected into a floating gate, for example), and the other threshold voltage thereof is set to a low threshold voltage (threshold voltage in an erased state in which the electrons are emitted from the floating gate, for example) in the above description, the read transistor element is regarded as being kept in a cutoff state in a high threshold voltage state, whereas the read transistor element is regarded as being kept in an on state in a low threshold voltage state (the inverse thereof might naturally take place depending on a conduction type of a transistor device or element) For example, the first drain electrode and control gate electrode of the non-volatile storage transistor element are set to 0V like a circuit's ground voltage, the first source electrode of the non-volatile storage transistor element is set to 6V, and electrons are extracted or drawn out from the floating gate electrode to the first source electrode through a tunnel current, thereby making it possible to achieve an erased state with respect to the non-volatile storage transistor element. For example, the first drain electrode and control gate electrode of the non-volatile storage transistor element are set to 5V, the first source electrode of the non-volatile storage transistor element is set to 0V like the circuit's ground voltage, and hot electrons developed in the first drain electrode are injected into the floating gate, thereby making it possible to achieve the write state.

Since the floating gate electrode of the non-volatile storage transistor element serves as the gate electrode of the read transistor element, the read transistor element enters into a switch state or takes mutual conductance according to an electron injection state/electron emission state, in other words, a write state/erase state. The read transistor element can pass a current corresponding to it to the transfer means. It is not necessary to cause a channel current to flow through the transistor according to the threshold voltage of the non-volatile storage transistor element upon a read operation from the above description. Accordingly, the source electrode and drain electrode of the non-volatile storage transistor element may respectively be set to the circuit's ground voltage like 0V upon the read operation. Thus, the injection of weak hot electrons does not take place at the floating gate as viewed from the first drain electrode. At this time, no tunnel current is developed either where the control gate electrode is also set to the circuit's ground potential. Thus, it is possible to enhance long-term data retention performance and implement a reduction in read defective proportion.

Each of the electric fuses used as the second memory elements may comprise a flash memory cell having a stack structure in which floating and control gates are vertically stacked on each other. However, a manufacturing process becomes complex as compared with a CMOS process or the like. If consideration is paid to the application of the relieving means to a semiconductor device such as a DRAM or the like manufactured by the CMOS process, then the second memory elements like the electric fuses is more preferable if capable of being manufactured by either the CMOS process or a monolayer polysilicon gate process. For example, the non-volatile storage transistor element has a MIS capacitive element provided with a capacitive electrode functioning as a control gate electrode, on a first semiconductor region through a insulating layer, and a MIS transistor having a first source electrode, a first drain electrode and a gate electrode formed in a second semiconductor region. Further, the capacitive electrode may be configured so as to serve as a floating gate electrode by being commonly connected to each gate electrode.

Thus, the semiconductor device having the second memory elements like the electric fuses can be manufactured without definitely adding a new process to a normal logic circuit process or a general-purpose DRAM process or the like, like the CMOS process or the monolayer polysilicon gate process.

[3] A semiconductor device according to another aspect of the present invention includes a memory cell array having a plurality of memory cells, a first relief address storage circuit including a plurality of first memory elements each of which stores address information of a memory cell to be relieved in the memory cells, a second relief address storage circuit including a plurality of second memory elements each of which stores address information of a memory cell to be relieved in the memory cells, and an address signal wiring which commonly transmits address information to be compared with respective memory address information to the first relief address storage circuit and the second relief address storage circuit. The first memory element and the second memory element have element structures different from each other. The first relief address storage circuit is formed in a first area along the address signal wring. The second relief address storage circuit is formed in a second area adjacent to the first area.

A semiconductor device according to a further aspect of the present invention includes a memory cell array having a plurality of memory cells, some of which are used as redundant memory cells substituted for other memory cells, a first relief address storage circuit including a plurality of first memory elements each of which stores address information of a memory cell to be relieved by each redundant memory cell and a plurality of first comparators, a second relief address storage circuit including a plurality of second memory elements each of which stores address information of a memory cell to be relieved by each redundant memory cell and a plurality of second comparators, and an address signal wiring which commonly transmits address information to be compared with respective memory address information to the first relief address storage circuit and the second relief address storage circuit. The first memory element and the second memory element have element structures different from each other. The first comparator outputs a first select signal when the address information stored in each first storage element and signal information on the address signal wiring are found to coincide with each other from the result of comparison therebetween. The second comparator outputs a second select signal when the address information stored in each second storage element and signal information on the address signal wiring are found to coincide with each other from the result of comparison therebetween. The semiconductor device has a selector circuit which selects either the first select signal or the second select signal to thereby set the selected signal as a signal for providing instructions for selecting each redundant memory cell.

DETAILED DESCRIPTION

Figure 2:
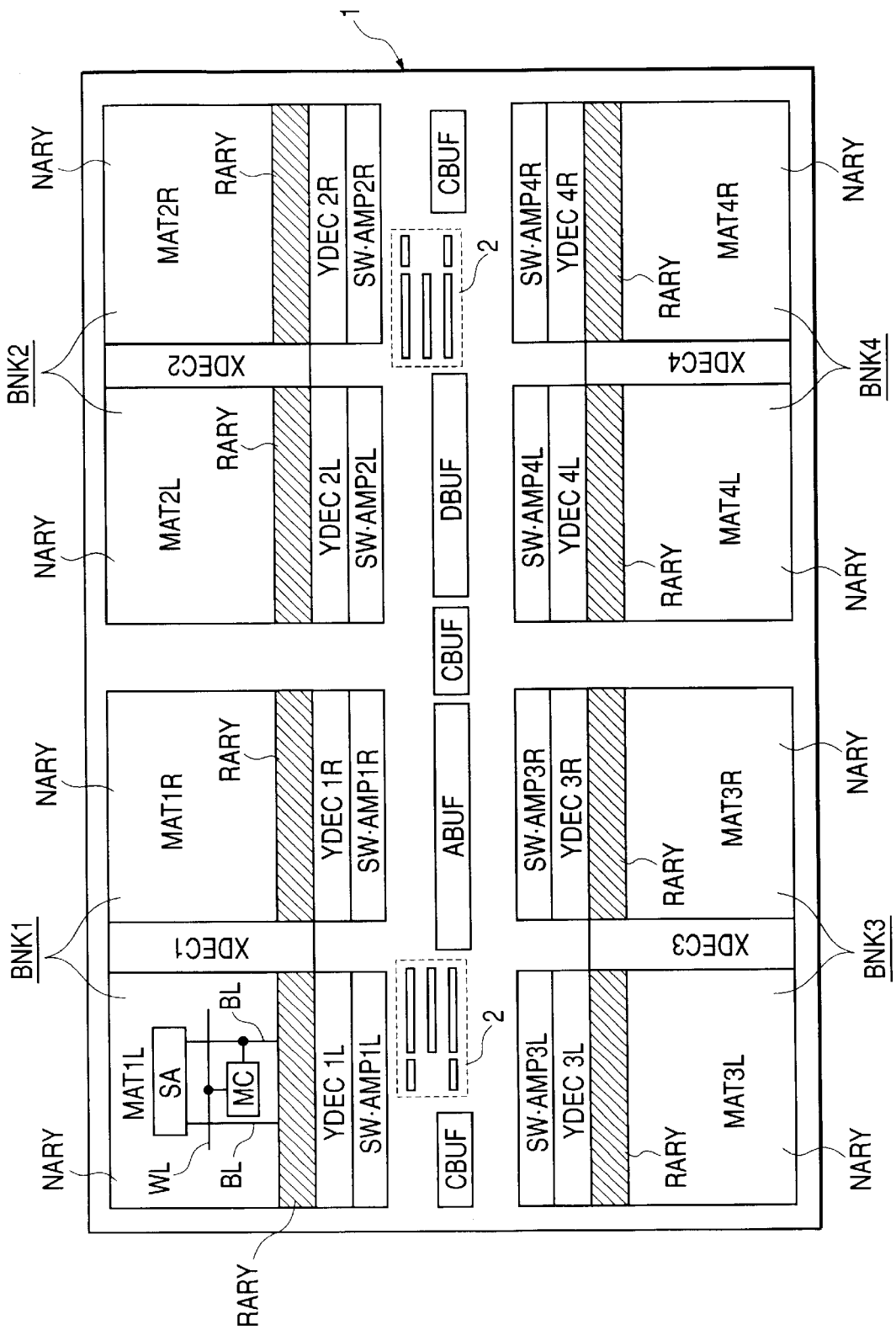
FIG. 2 is a block diagram showing a DRAM corresponding to one example of a semiconductor device according to the present invention.

FIG. 2 shows a DRAM illustrative of one example of a semiconductor device according to the present invention. Although not restricted in particular, the DRAM shown in the same drawing is formed on a single semiconductor substrate (semiconductor chip) like monocrystal silicon by the known CMOS semiconductor integrated circuit manufacturing technology.

A DRAM 1 has four memory banks BNK1 through BNK4. The respective memory banks BNK1 through BNK4 are respectively divided into two masts MAT1R, MAT1L through MAT4R, MAT4L from side to side. X decoders (row address decoders) XDEC1 through XDEC4 are respectively disposed between the respective mats. Y decoders (column address decoders) YDEC1R, YDEC1L through YDEC4R, YDEC4L, and column switches/main amplifier circuits SW/AMP1R, SW/AMP1L through SW/AMP4R, SW/AMP4L are disposed every mats.

A data input/output buffer DBUF, an address input buffer ABUF and buffers CBUF for inputting memory access control signals are disposed between the memory banks BNK1, BNK2 and BNK3, BNK4 placed in up-and-down two stages. Unillustrated external connecting electrodes such as bonding pads, etc. connected to the buffers DBUF, ABUF and CBUF are placed on the periphery thereof.

Although not restricted in particular, the memory mats MAT1R, MAT1L through MAT4R, MAT4L respectively have a large number of dynamic memory cells MC which respectively have data input/output terminals connected to folded intersection type bit lines BL with sense amplifiers as the centers, and select terminals connected to word lines WL, as illustrated typically by the memory mat MAT1L. One intersection type may be used as an alternative to the folded intersection type. An X decoder typified by XDEC1 selects a word line WL. A sense amplifier SA amplifies memory information read into complementary bit lines BL and BL from a selected memory cell MC. The complementary bit lines BL and BL are selected by a column switch of a column switch/amplifier circuit typified by SW/AMP1L according to a select signal from a Y decoder typified by YDEC1L. If a data read operation is taken, then data read from the corresponding memory cell is amplified by its corresponding main amplifier of the column switch/main amplifier circuit typified by SW/AMP1L and outputted from the data input/output buffer DBUF to the outside. If a data write operation is done, then write data inputted from the data input/output buffer DBUF is amplified by its corresponding main amplifier of the column switch/main amplifier circuit typified by SW/AMP1L, followed by supply to the corresponding complementary bit lines. Although a detailed description is omitted in particular, the DRAM is to carry out a refresh operation relative to the stored information of each memory cell at required refresh intervals The respective memory mats MAT1L, MAT1R through MAT4L, MAT4R are respectively divided into normal arrays (first memory arrays) NARY and redundant arrays (second memory arrays) RARY. The memory cells are disposed in the respective arrays NARY and RARY. The redundant array RARY is ranked as a relief array used to relieve a defect developed in the normal array NARY, whereas the normal array NARY is ranked as a relieved array.

Relief circuits 2 for performing relieving operations such as the storage of relief address information for substituting a memory cell of the redundant array RARY for the defect of the normal array NARY, the comparison between an access address and the relief address information, etc. are respectively provided in areas between the respective memory banks. The relief of each memory is generally effected on each of an X address (row address) and a Y address (column address). However, the relief of the X address will be described here as an example.

Figure 3:
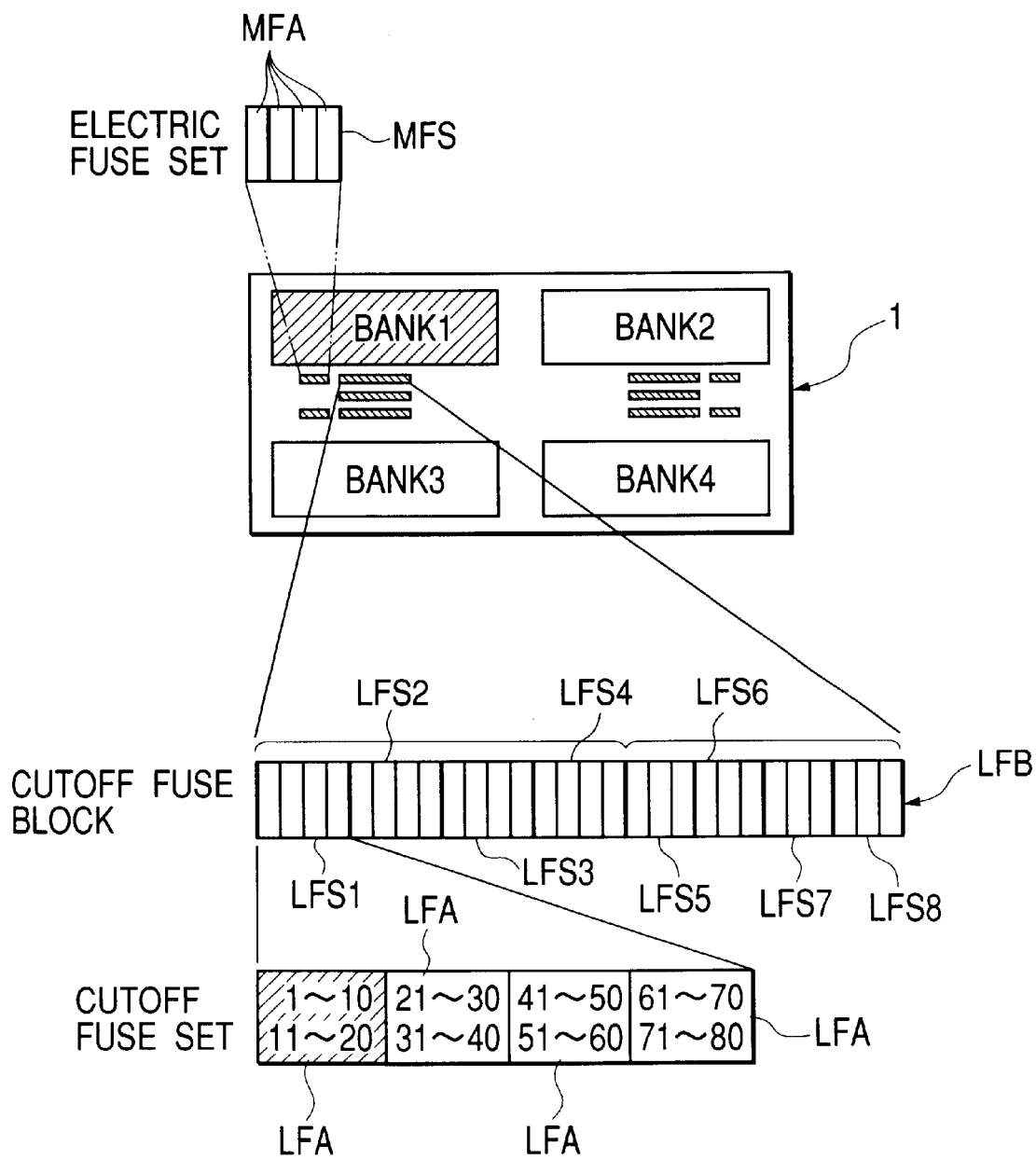
FIG. 3 is a explanatory view showing the concept of a relief scale in the DRAM shown in FIG. 2.

FIG. 3 shows the concept of a relief scale. Although not restricted in particular, the relief scale corresponds to 28 word lines in memory bank units. Namely, according to the example of FIG. 2, redundant word lines corresponding to 28 word lines are disposed in one area of a redundant array RARY in association with word lines of a normal array NARY in one memory bank. For which normal word line a redundant word line should be substituted, is stored in each of a cutoff fuse block LFB and an electric fuse set MFS as a relief address. The cutoff fuse block LFB has eight cutoff fuse sets LFS1 through LFS8. Of these, the four cutoff fuse sets LFS1 through LFS4 respectively have four relief address cutoff storage circuits (first relief address storage circuit) LFA using laser fuses. The four cutoff fuse sets LFS5 through LFS8 respectively have three relief address cutoff storage circuits LFA using laser fuses. According to the laser fuse (first memory or storage element), the logical value of each memory information is determined according to the presence or absence of its cutoff. In the example shown in FIG. 3, one relief address (address for one word line in the example) can be specified by 10-bit address signals, and the storage of the relief address is carried out based on the complementary address signals. Therefore, twenty laser fuses are disposed in one relief address cutoff storage circuit LFA.

The electric fuse set MFS has four circuits (second relief address storage circuit) MFA for electrically storing each relief address through the use of electric fuses. The electric fuse (second storage element) has a configuration using an electrically programmable non-volatile memory element capable of performing information storage according to a difference in threshold voltage. The details of the configuration per se will be described later.

Figure 4:
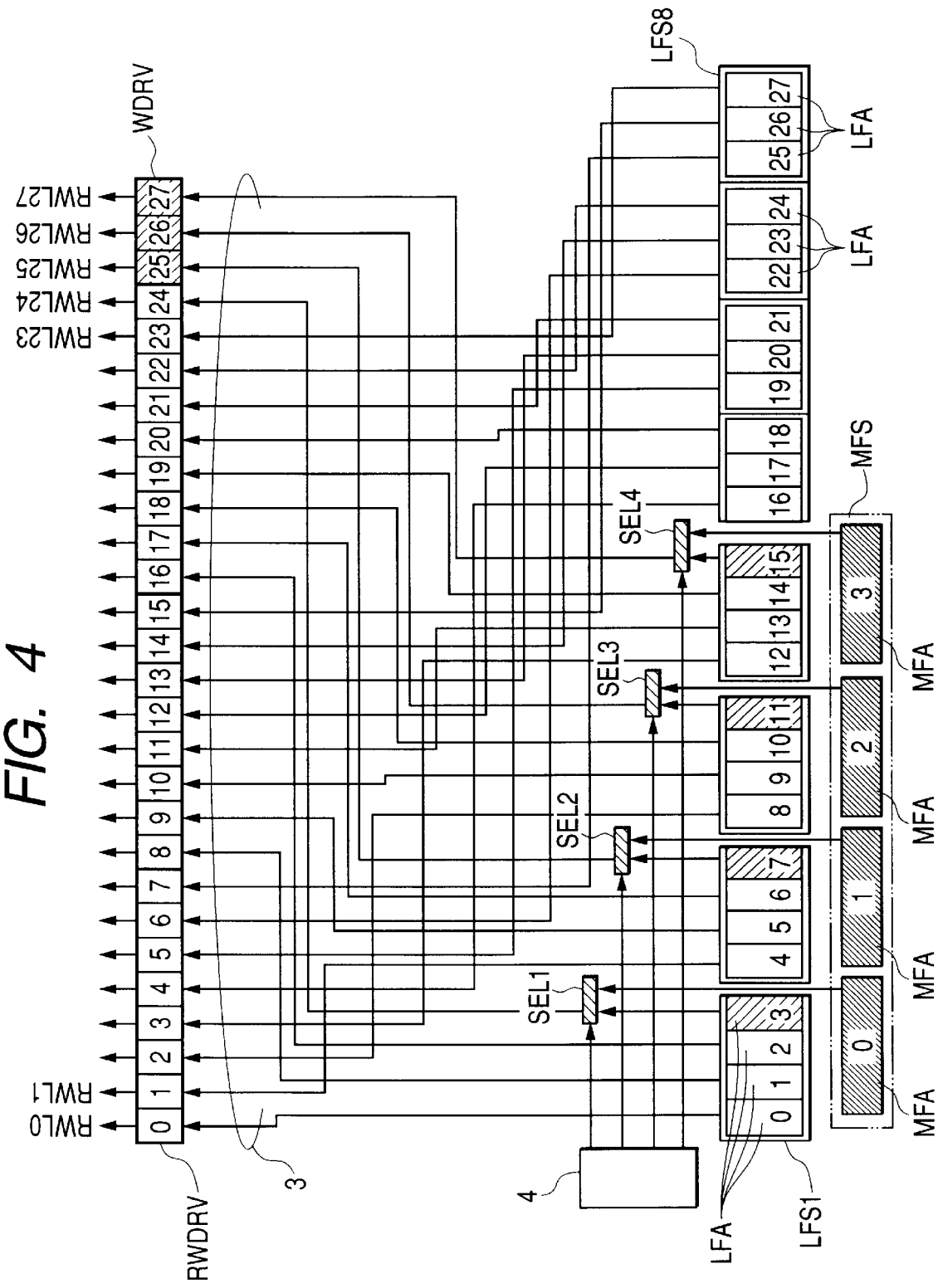
FIG. 4 is an explanatory view illustrating the concept of a relieving system for one memory bank in the DRAM shown in FIG. 2.

FIG. 4 shows the concept of a relieving system used for one memory bank. When redundant word lines corresponding to 28 word lines can be allocated to relieving in one memory bank as is apparent from the description of FIG. 3, 28 relief address cutoff storage circuits LFA equal to an upper limit for relief are provided, and four circuits for electrically storing relief addresses are further provided. In brief, even if the four of the 28 redundant word lines are of laser or electric fuses, the setting of each relief address is allowed. In FIG. 4 showing the concept of the relieving system at this time, RWL0 through RWL27 indicate redundant word lines, and RWDRV indicates a redundant word driver for driving the redundant word lines, respectively. The relief address cutoff storage circuits LFA are respectively assigned to the selection of the inherent redundant word lines. One designated at numeral 3 is a general term for signals for selecting the redundant word lines. Of these, the selection of the redundant word lines RWL24 through RWL27 is allowed by any of the cutoff storage circuits LFA designated at numerals #3, #7, #11 and #15 or the electric storage circuits MFA designated at numerals #1, #2, #3 and #4. Any output, which is used for the selection of its corresponding redundant word line, is selected by any of selectors SEL1 through SEL4. Its selection can programmably be determined by an electrically programmable electric fuse circuit 4 for performing information storage according to a difference in threshold voltage in the same manner as described above. Incidentally, it is not limited to a configuration selectable by any of the selectors SELL through SEL4. Each of the electric fuse sets MFA may be assigned to the selection of its dedicated redundant word line.

An address for a word line to be relieved in a normal array NARY used as a relieved circuit, in other words, a row address common to each memory cell whose select terminal is connected to the word line, is set to each of the relief address cutoff storage circuits LFA and the electric storage circuits MFA. Relief in a wafer stage is done by cutting off a laser fuse of each cutoff storage circuit LFA with laser. When an additional defect occurs after assembly or the relief in the wafer stage is imperfect, the cutting off of the laser fuse is no longer allowed. Therefore, the corresponding electric storage circuit MFA is electrically programmed to store a new relief address. In the DRAM subjected to the relief, the cutoff storage circuits LFA and the electric storage circuits MFA respectively compare relief and access addresses. When they are found to coincide with each other, a signal 3 for selecting its corresponding redundant word line is set to a select level. When any one of the relief addresses stored in the cutoff storage circuits LFA and the electric storage circuits MFA coincides with its corresponding access address (relief hit), addressing to a normal array NARY by the access address is restrained. As an alternative to it, a relief-hit redundant word line is subjected to addressing to perform a memory operation.

When the redundant word lines corresponding to the 28 word lines can be allocated to the relieving in one memory bank as described above, the 28 relief address cutoff storage circuits LFA equal to the upper limit for relief are provided, and the four circuits for electrically storing the relief addresses are further provided. Even if the four of the 28 redundant word lines are of the laser or electric fuses, the setting of each relief address is allowed. When a defect corresponding to the full upper limit first takes place with respect to an upper limit relievable by a relief circuit, it is impossible to relieve a new or additional defect developed after its relief. If the first defect is less than the relievable upper limit, it is then possible to relieve the new defect developed after its relief. When consideration is given to an improvement in the efficiency of relieving processing in the former, the execution of relieving processing by the same procedure even if the first defect corresponds or uncorresponds to the full upper limit is efficient. In consideration of it, the number of addresses storable by the laser fuses is set equal to the upper limit of the number of relief addresses relievable by the redundant word lines.

Figure 5:
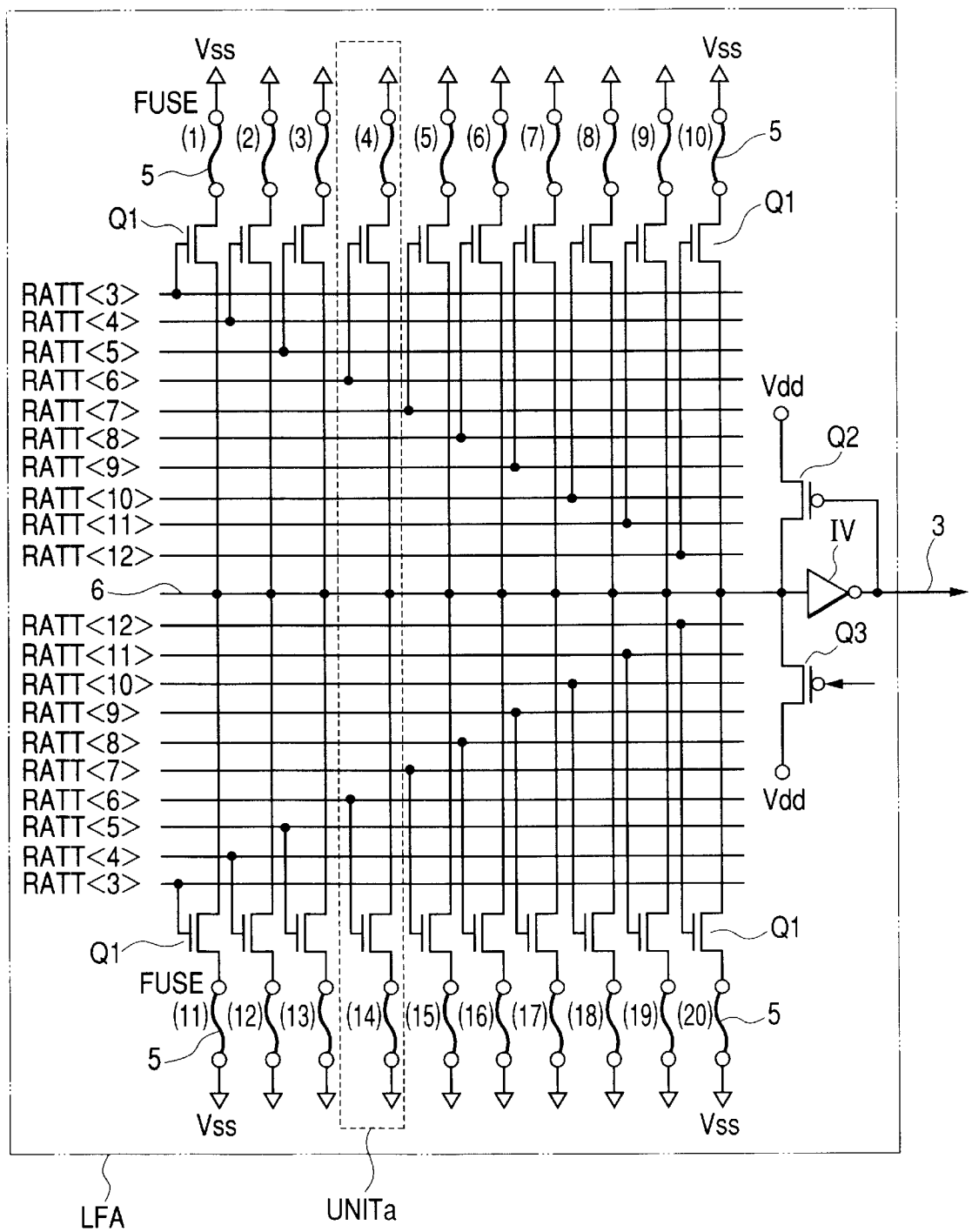
FIG. 5 is a circuit diagram showing a specific example of a cutoff storage circuit.

FIG. 5 shows a specific example of a cutoff storage circuit LFA. RATT<i> (where i=3 to 12) indicate non-inversion row address wirings for row address signals, and RABT<i> indicate inversion row address wirings for the row address signals, respectively. They are collectively called internal complementary row address signal wirings, the number of which is set to twenty corresponding to complementary address signals for 10-bit address signals A3 through A12 in the present example. The gates of n channel type switch MOS transistors Q1 are respectively connected to the internal complementary row address signal wirings RATT<i> and RABT<i>. Laser fuses 5 are respectively disposed between the sources of the MOS transistors Q1 and circuit's ground terminals Vss. The drains of the MOS transistors Q1 are commonly connected to a sense line 6. A p channel type precharge MOS transistor Q3 is connected to the sense line 6, and a clamping circuit comprising a p channel type MOS transistor Q2 and an inverter IV is connected to the sense line 6. The MOS transistor Q1 is shown as one example of a first comparator.

The laser fuses 5 are kept in connected states in their initial states. When complementary signals for relief addresses A12 through A3 are inputted to relief address complementary row address signal wirings RATT<i> and RABT<i>, programs for relief addresses serve so as to cut off the high-level signal wirings, in other words, the fuses on the turned-on MOS transistor side. When, for example, the relief addresses A12 through A3 are given as "0001010101", the relief addresses are set by cutting off the laser fuses designated at #20, #19, #18, #7, #16, #5, #14, #3, #12, and #1. As is apparent from it, when the address signals for the set relief addresses are inputted, the fuses connected to the MOS transistors Q1 turned on by the same signals are all separated from the ground terminals Vss, and hence no sense line 6 is discharged. When addresses other than the set relief addresses are inputted, the sense line 6 is inevitably discharged. Thus, whether or not a relief hit is made, is determined according to whether the sense line 6 is discharged. For example, the precharge MOS transistor Q3 precharges the sense line 6 to a high level (source voltage Vdd) every memory access cycles. In such a condition, the clamping circuit Q2 and IV is brought into a clamped state, so that a signal 3 is initially set to a high level. If the relief hit is made, then the clamped state of the clamping circuit Q2 and IV is maintained.

Figure 6:
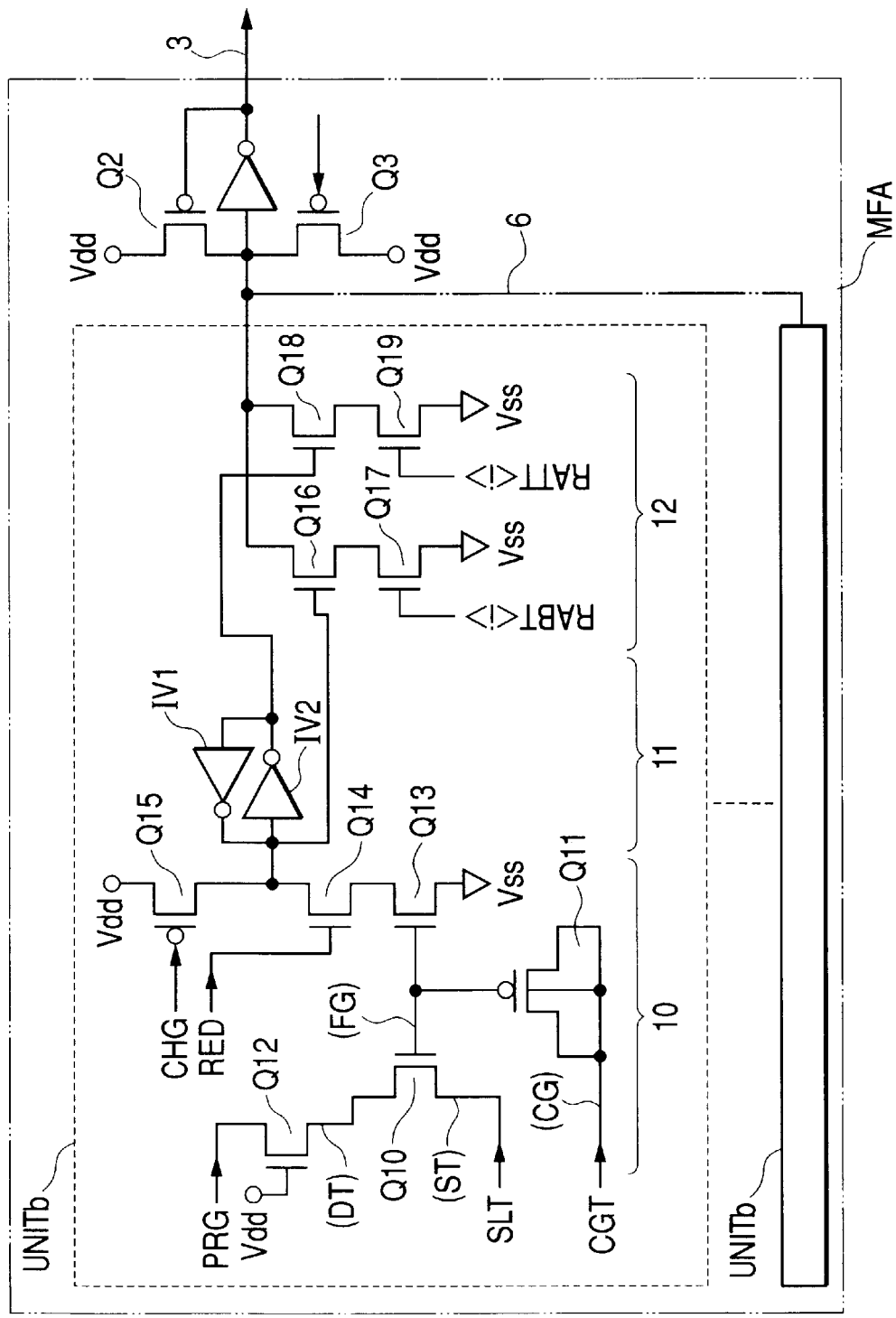
FIG. 6 a circuit diagram depicting a specific example of an electric storage circuit.

FIG. 6 shows a specific example of an electric storage circuit MFA. The electric storage circuit MFA has ten sets of units UNITb each corresponding to a row address one bit. The outputs of the respective units UNITb are commonly connected to a sense line 6 in a manner similar to FIG. 5. A precharge MOS transistor Q3, and a MOS transistor Q2 and an inverter IV for clamping are connected to the sense line 6. The unit UNITb shown in FIG. 6 corresponds to a unit UNITa corresponding to an address one bit shown in FIG. 5.

The unit UNITb has an electric fuse portion 11, a latch portion 11 and a comparison portion 12. The latch portion 11 and the comparison portion 12 are defined as one example of a second comparator.

The electric fuse portion 10 is one for realizing a structure which causes information holding performance to have high reliability over a long period. The electric fuse portion 10 comprises an n channel type MOS transistor Q10, a p channel type MOS capacitive element Q11, and an n channel type read MOS transistor Q13. The MOS transistor Q10 and the MOS capacitive element Q11 constitute a first source electrode ST, a first drain electrode DT, a floating gate electrode FG and a control gate electrode CG and implement a non-volatile storage transistor device or element capable of having different threshold voltages. A voltage PRG is applied to the drain electrode DT through an n channel type MOS transistor Q12. A voltage SLT is applied to the source electrode ST, and a voltage CGT is applied to the control gate electrode CG.

The read MOS transistor Q13 has the floating gate electrode FG set as a gate electrode and is capable of having mutual conductances different according to the threshold voltages held by the non-volatile storage elements. A path for a current corresponding to the mutual conductance of the read MOS transistor Q13 is constituted or formed by a series circuit comprised of a p channel type precharge MOS transistor Q15 and an n channel type gate MOS transistor Q14.

When, for example, one threshold voltage of the non-volatile storage transistor element comprised of the MOS transistor Q10 and MOS capacitive element Q11 is set to a relatively high threshold voltage (threshold voltage in a write state in which electrons are injected into the floating gate (FG), for example), and the other threshold voltage thereof is set to a low threshold voltage (threshold voltage in an erased state in which the electrons are emitted from the floating gate, for example) in the electric fuse portion 10, the read MOS transistor Q13 is brought into a cutoff state in a high threshold voltage state, whereas the read MOS transistor Q13 is brought into an on state in a low threshold voltage state. For example, the first drain electrode (DT) and control gate electrode (CGT) of the non-volatile storage transistor element (Q10, Q11) are set to 0V like a circuit's ground voltage, the first source electrode (ST) of the non-volatile storage transistor element (Q10, Q11) is set to 6V, and electrons are extracted or drawn out from the floating gate electrode (FG) to the first source electrode (ST) through a tunnel current, thereby making it possible to achieve an erased state with respect to the non-volatile storage transistor element (Q10, Q11) For example, the first drain electrode (DT) and control gate electrode (CG) of the non-volatile storage transistor element (Q10, Q11) are set to 5V, the first source electrode (ST) of the non-volatile storage transistor element (Q10, Q11) is set to 0V like the circuit's ground voltage Vss, and hot electrons developed in the first drain electrode (DT) are injected into the floating gate (FG), thereby making it possible to achieve a write state with respect to the non-volatile storage transistor element (Q10, Q11).

Since the floating gate electrode (FG) of the non-volatile storage transistor element (Q10, Q11) serves as the gate electrode of the read MOS transistor Q13, the read MOS transistor Q13 enters into a switch state or takes mutual conductance according to an electron injection state/electron emission state, in other words, a write state/erase state. The read MOS transistor Q13 can pass a current corresponding to it through the gate MOS transistor Q14. It is not necessary to cause a channel current to flow through the MOS transistor Q10 according to the threshold voltage of the non-volatile storage transistor element (Q10, Q11) upon a read operation from the above description. Accordingly, the source electrode (ST) and drain electrode (DT) of the non-volatile storage transistor element (Q10, Q11) may respectively be set to the circuit's ground voltage Vss like 0V upon the read operation. Thus, the injection of weak hot electrons does not take place at the floating gate (FG) as viewed from the first drain electrode (DT). At this time, no tunnel current is developed either where the control gate electrode (CG) is also set to the circuit's ground potential Vss. Thus, it is possible to enhance long-term data retention performance and implement a reduction in read defective proportion.

The latch portion 11 comprises a static latch in which inverters IV1 and IV2 are reversely parallel-connected.

The comparison portion 12 has a series path of n channel type MOS transistors Q16 and Q17, and a series path of n cannel type MOS transistors Q18 and Q19 both of which are provided between the sense line 6 and the circuit's ground terminal Vss. The output of the inverter IV1 is connected to the gate of the MOS transistor Q16, and the output of the inverter IV2 is connected to the gate of the MOS transistor Q18. The gate of the MOS transistor Q17 is connected to the inversion row address wirings RABT<I> for the row address signals, and the gate of the MOS transistor Q19 is connected to the non-inversion row address wirings RATT<i> for the row address signals.

When a relief address is stored in the electric fuse portion 10, although not restricted in particular, an address bit "1" for a relief address is defined as an object to be written, and the others are caused to hold an erased state. If the address bit for the relief address corresponding to one electric fuse portion 10 illustrated in FIG. 6 by way of example is "1", then writing is effected on the corresponding electric fuse portion 10, the threshold voltage of the non-volatile storage transistor element (Q10, Q11) is brought into a high threshold voltage state, and the read MOS transistor Q13 is brought into a cutoff state. In the erased state relative to the others, the read MOS transistor Q13 is brought to an on state according to a low threshold voltage state.

Although not restricted in particular, the read operation for the electric fuse portion 10 is carried out at power-on or upon reset, and read data is held in the latch portion 11 so long as an operating source is maintained. As those corresponding to the electric fuse portion 10, which have been written therein in association with the logical value "1" of each relief address, the output of the inverter IN1 is set to "1", and the output of the inverter IV2 is set to "0". Thus, it is possible to determine whether the corresponding address bit coincides with the corresponding bit for the relief address, according to a switch state of the MOS transistor Q17 which receives RABT<i> at its gate. Since RABT<i> is of an inverted level of a corresponding access row address bit, the MOS transistor Q17 is held in an off state and the sense line 6 is kept at a high level if the corresponding access row address bit is "1". As those corresponding to the electric fuse portion 10 brought to the erased state in association with the logical value "0" of the relief address, and logical values "1" and "0" of non-relief addresses, the output of the inverter IN1 and the output of the inverter IN2 are respectively set to "0" and "1" contrary to the above. Thus, in this case, whether the corresponding address bit coincides with the corresponding bit for each relief address can be determined according to a switch state of the MOS transistor Q19 that receives RATT<i> at its gate. Since RATT<i> is of a non-inverted level of a corresponding access row address bit, the MOS transistor Q17 is held in an off state and the sense line 6 is maintained at a high level if the corresponding access row address bit is "0". As is apparent from it, when the access row address coincident with a programmed relief address is supplied, the sense line 6 is kept at a high level. The relation is similar to the cutoff storage circuit LFA using the cutoff fuses.

In order to avoid a decision as to a relief hit made to non-relief addresses in which all bits are "0", the electric storage circuit MFA has a unit for generating a relief enable bit although not shown in particular. The unit includes the electric fuse portion 10 and the latch portion 11. When the electric storage circuit MFA gives relief, the corresponding relief address bit is written into the electric fuse portion 10, the output of the inverter IV1 is connected to its corresponding sense line 6, and the sense line 6 for each electric storage circuit MFA unused for relief is forcedly set to a ground voltage Vss.

The non-volatile storage transistor element (Q10, Q11) may be comprised of a flash memory cell having a stack structure in which floating and control gates are vertically stacked on each other. However, a manufacturing process becomes complex as compared with a CMOS process or the like. If consideration is paid to the application of the relieving means shown in FIG. 6 to a semiconductor device such as a DRAM or the like manufactured by the CMOS process, then the non-volatile storage transistor element (Q10, Q11) may be convenient if capable of being manufactured by either the CMOS process or a monolayer polysilicon gate process. Although not shown in the drawing in particular, for example, the non-volatile storage transistor element (Q10, Q11) has a MIS capacitive element Q11 provided with a capacitive electrode (FG) functioning as a control gate electrode (CG), on an n-type well region (first semiconductor region) through a insulating layer like a gate oxide film, and a MIS transistor Q10 having a first source electrode (ST), a first drain electrode (DT) and a gate electrode (FG) formed in a p-type well region (second semiconductor region). Further, the capacitive electrode may be configured so as to serve as a floating gate electrode (FG) by being commonly connected to the gate electrode.

Thus, the semiconductor device having the second memory elements like the electric fuses can be manufactured without definitely adding a new process to a normal logic circuit process or a general-purpose DRAM process or the like, like the CMOS process or the monolayer polysilicon gate process.

Figure 1:
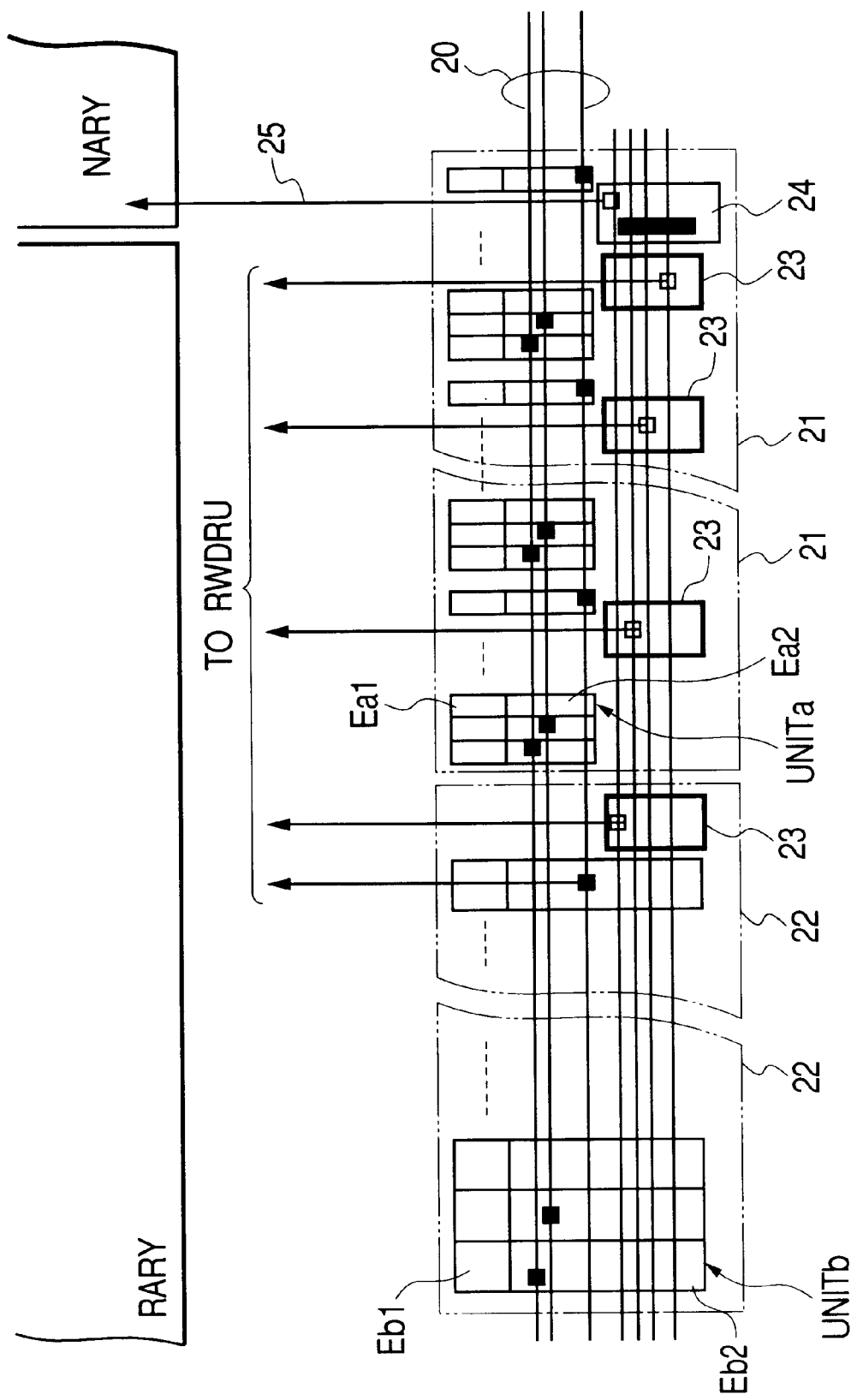
FIG. 1 is an explanatory view illustrating a layout configuration of a circuit for electrically storing each relief address and a relief address cutoff storage circuit, both of which constitute an electric fuse set.

FIG. 1 illustrates a layout configuration of a circuit MFS for electrically storing each relief address and a relief address cutoff storage circuit LFS, both of which constitute the electric fuse set. As is apparent from a comparison between FIG. 5 and FIG. 6, units UNITa and UNITb are much different in circuit scale with respect to a row address one bit. With attention being focused on it, an address signal wiring 20 for supplying row address signals for address comparison is linearly laid on the electric storage circuit MFS and the cutoff storage circuit LFS. The relief address cutoff storage circuit LFS is formed in a first area 21 along the address signal wiring 20, and the electric storage circuit MFS is formed in a second area 22 adjacent to it. In the unit UNITb of the electric storage circuit MFS in FIG. 1, Eb1 indicates an area for forming an electric fuse portion 10, and Eb2 indicates an area for forming a latch portion 11 and a comparison portion 12 which constitute a second comparator. In the unit UNITa of the cutoff storage circuit LFS, Ea1 indicates an area for forming laser fuses 5, and Ea2 indicates an area for forming a switch MOS transistor Q1 corresponding to a first comparator. An area 23 is an area for forming the precharge transistor Q3 and clamping circuit (Q2, IV). The output of the clamping circuit (Q2, IV) in each area 23 is supplied to the redundant word driver RWDRV as a redundant word line select signal according to the configuration of FIG. 4. Further, the output of the claming circuit (Q2, IV) in each area 23 is supplied to a relief control circuit 24. When a relief hit is determined even one, based on the outputs of the clamping circuits (Q2, IV) in the areas 23, the relief control circuit 24 activates an access prohibition signal 25 for prohibiting the operations of a normal word driver and a normal row decoder to control switching from an access to a normal memory array NARY to an access to a redundant memory array RARY.

The first area 21 and the second area 22 are allocated along the address signal wiring 20 and they are disposed so as to adjoin each other. Therefore, even if the electric fuses and cutoff fuses different in device structure and circuit scale are caused to coexist for relief address storage, the difference between by-chip occupied areas due to the difference between their configurations can be adjusted based on the size extending in the direction of the address signal wiring 20, and an increase in the by-chip occupied area can be restrained to the utmost from a layout viewpoint when the electric fuses are used together in each relief circuit.

Figure 7:
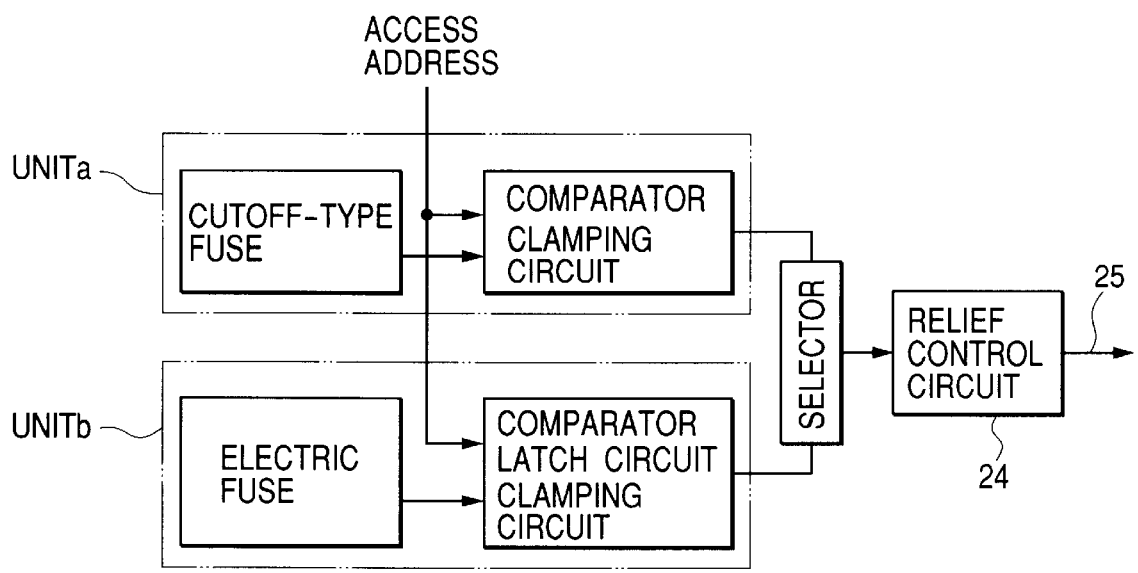
FIG. 7 is an explanatory view typically showing the state of sharing of an address signal wiring between a first area and a second area.

Address comparators in the first and second areas 21 and 22 share the use of the address signal wiring 20. Since the first area 21 and the second area 22 are disposed along the address signal wiring 20, there is no necessity to separately provide them. Sharing the address signal wiring 20 therebetween serves so as to restrain an increase in by-chip occupied area. This state can be represented as shown in FIG. 7 if typically shown. The relief control circuit 24 is shared between the electric storage circuit (UNITb) and the cutoff storage circuit (UNITa). As a desirable form, the address signal wiring is provided so as to linearly cross over a portion where the first and second areas 21 and 22 are adjacent to each other. If a bent portion is less reduced, then a wiring channel width for the address signal wiring 20 can be made small correspondingly. Even from this point of view, a by-chip occupied area can be restrained from increasing.

Figure 8:
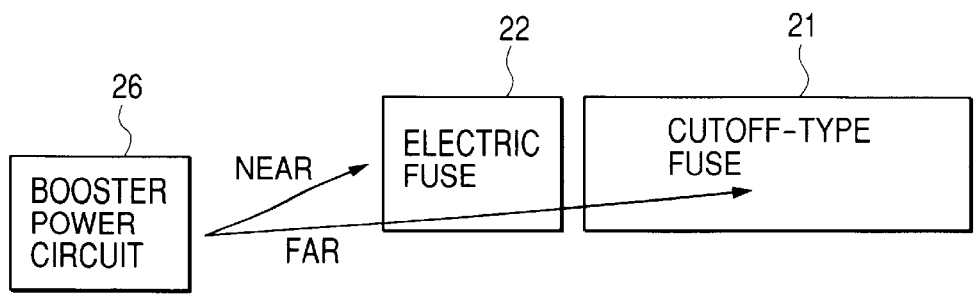
FIG. 8 is an explanatory view showing an example of the layout of an electric fuse and a cutoff fuse with respect to a circuit for generating a program voltage for programming the threshold voltage of the electric fuse.
Figure 9:
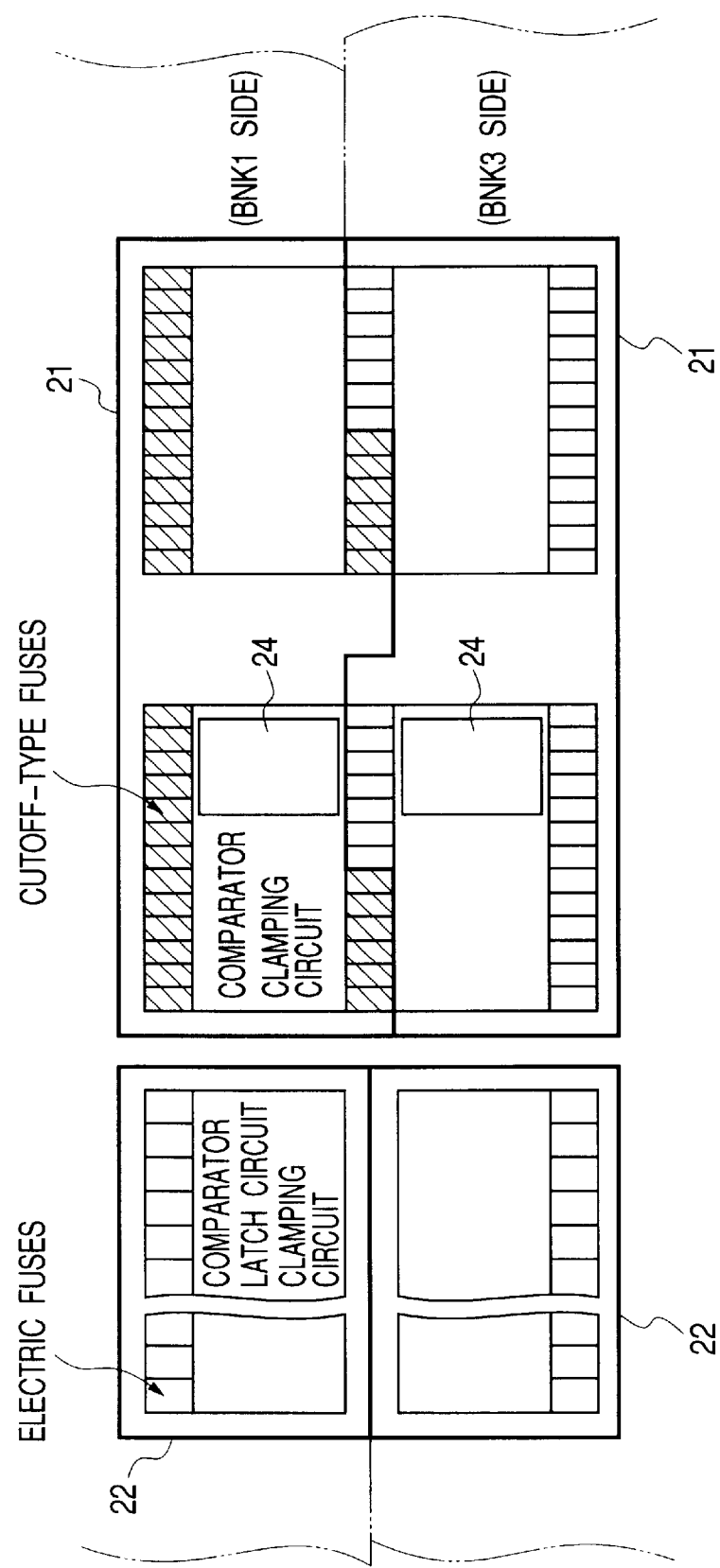
FIG. 9 is an explanatory view depicting an example in which the layout of cutoff fuses small in circuit scale is brought into high density in the form of a 3-stage layout.

When a high voltage is necessary for electrical writing into each electric fuse, an electric fuse may be disposed close to a booster power circuit 26 corresponding to a circuit for generating a program voltage for programming the threshold voltage of the electric fuse, rather than to a cutoff-type fuse as shown in FIG. 8 by way of example. Thus, a voltage wiring for transferring the program voltage to the electric fuse can be shortened, and an increase in the area occupied by a chip can be restrained even in this point of view.

Figure 10:
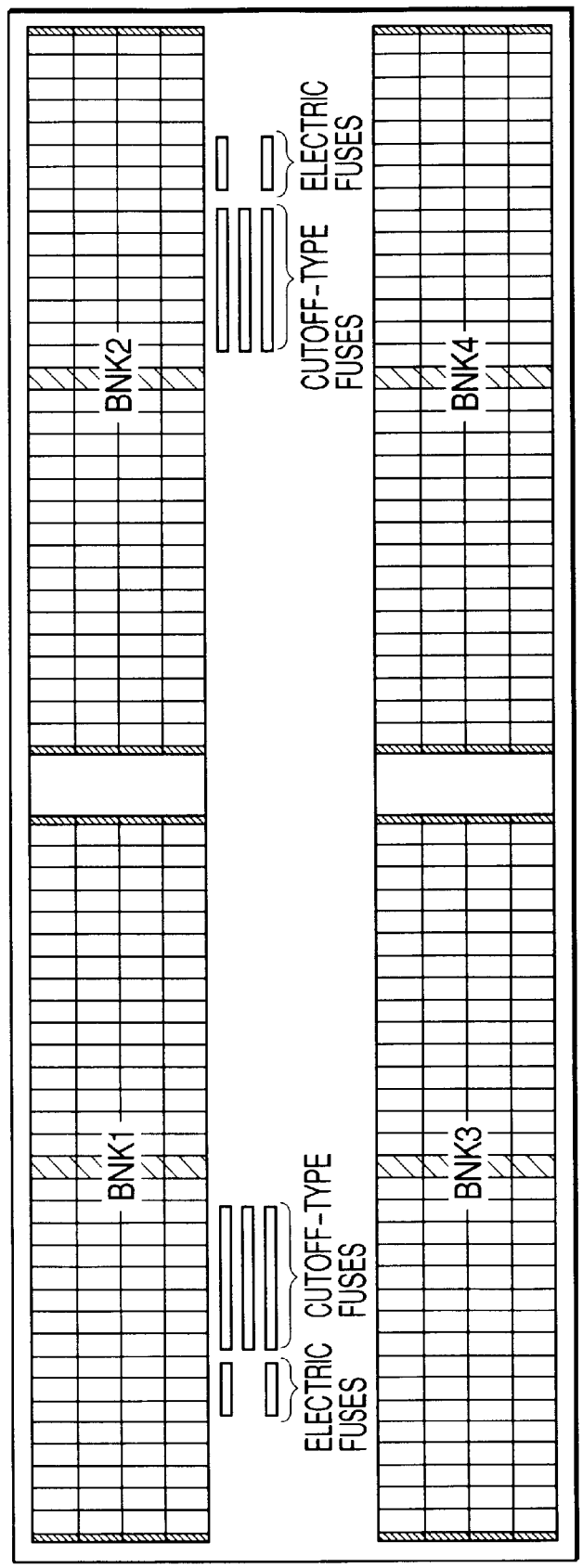
FIG. 10 is a block diagram showing a 3-stage spaced and laid-out state of cutoff fuses over the entirety of a DRAM.
Figure 11:
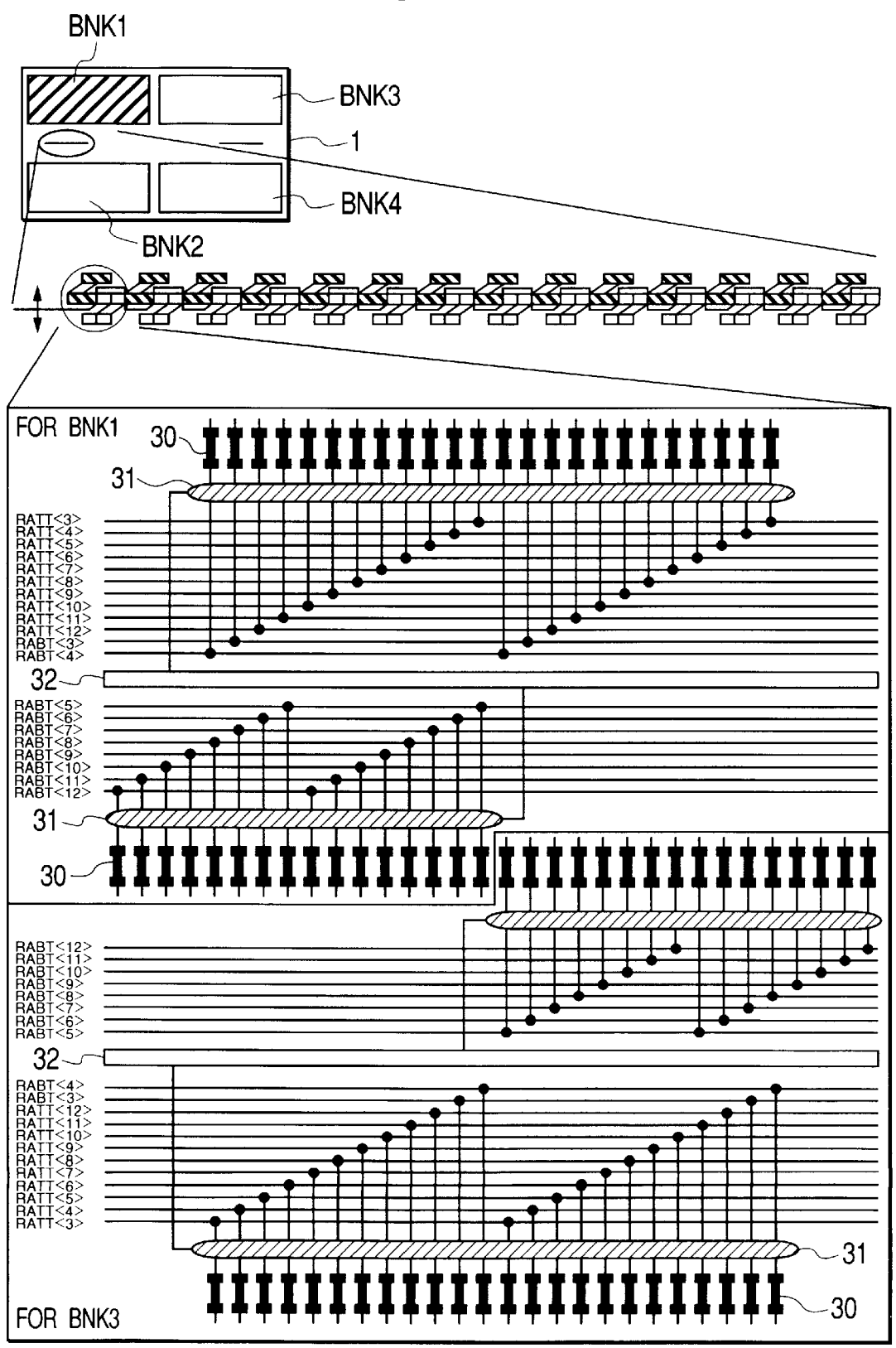
FIG. 11 is a circuit diagram illustrating a 3-stage spaced and laid-out state of cutoff fuses in details.

If consideration is given to a configuration wherein memory banks are disposed on both sides of the first area 21 and the second area 22 with both areas interposed therebetween, then electric fuses inherent in memory banks on the respective sides of the memory banks on both sides are disposed so as to be spaced in two stages in the second area 22 in which electric fuses relatively large in circuit scale are disposed. On the other hand, cutoff fuses inherent in memory banks on the respective sides of the memory banks on both sides can be disposed so as to be spaced in three stages altogether in the first area 21 in which cutoff fuses relatively small in circuit scale are disposed. If the layout of the cutoff fuses small in circuit scale is brought to high density in a three-stage layout, then an increase in the area occupied by a chip can be restrained even in this point of view. In FIG. 10, the state of a three-stage spaced layout of the cutoff fuses is shown over the entire DRAM1. FIG. 11 illustrates the state of the three-stage spaced layout of the cutoff fuses in further details. In FIG. 11, reference numerals 30 indicate arrays of laser fuses 5, reference numerals 31 indicate arrays of MOS transistors Q1, and reference numerals 32 indicate sense lines 6 or the like, respectively.

Figure 12:
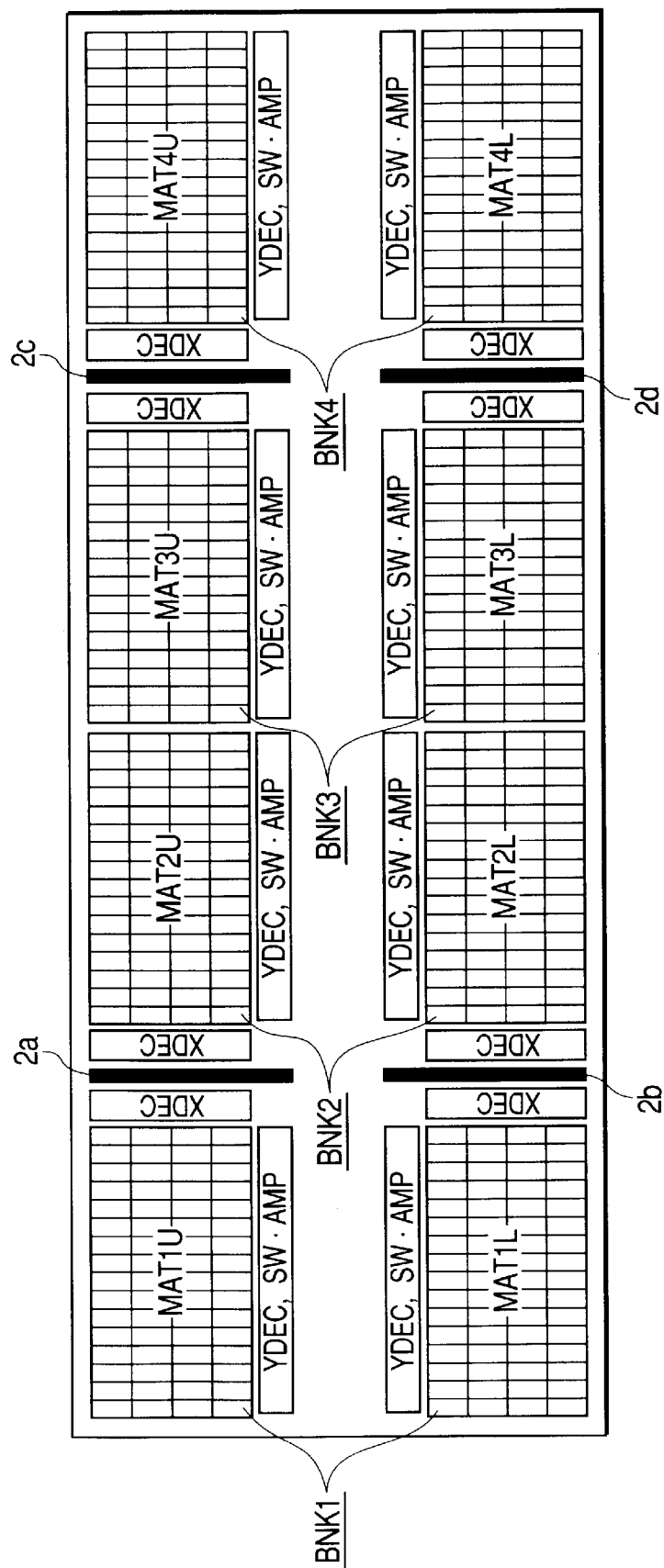
FIG. 12 is a block diagram showing another DRAM in which relief circuits and memory banks are different in layout from one another.

FIG. 12 shows an example in which the layout of relief circuits is changed. The configuration of the memory banks described in FIG. 2 may be formed as shown in FIG. 12. Further, relief circuits 2a through 2d may be disposed between respective adjacent X decoders XDEC. The relief circuits 2a through 2d respectively have configurations similar to the relief circuits 2. XDEC indicate row decoders, and YDEC indicate column decoders, SW/AMP indicate column switches/main amplifiers, respectively. The relief circuit 2a is assigned to its corresponding memory mats MAT1U and MAT2U, the relief circuit 2b is assigned to its corresponding memory mats MAT1L and MAT2L, the relief circuit 2c is assigned to its corresponding memory mats MAT3U and MAT4U, and the relief circuit 2d is assigned to its corresponding memory mats MAT3U and MAT4U, respectively.

While the invention made above by the present inventors has been described specifically based on the embodiments, the present invention is not limited to them. It is needless to say that various changes can be made thereto within the scope not departing from the substance thereof.

For example, the numbers of memory banks and memory mats may suitably be increased or decreased without being limited to the configurations described in FIG. 2 and the like. Further, the circuit configuration of each electric fuse may suitably be changed. If, for example, Q10, Q11 and Q13 shown in FIG. 6 are provided in plural sets and Q13 of the respective sets are connected in series, then the reliability with respect to the long-term retention of relief information is further improved. No limitations are imposed on an X address relief, and a Y address relief or both X and Y addresses may be available for relief. The numbers of stages for the electric and cutoff fuses are not limited to two or three and may be changed to a suitable number of stages. The present invention is not limited to the DRAM and can widely be applied to semiconductor devices such as a synchronous DRAM, a static DRAM, a system LSI or the like equipped with a central processing unit (CPU) or the like together with such a memory.

Advantageous effects obtained by a typical one of the inventions disclosed in the present application will be described in brief as follows:

When memory elements different in device or element structure as typified by electric and cutoff-type fuses are used to hold address information for relief, an increase in by-chip occupied area due to these memory elements can be reduced to the utmost from a layout viewpoint.

It is possible to enhance the reliability of long-term data retention at the time that address information for relief is held by an electric program.

We claim:

1. A semiconductor device comprising:
   a first memory unit and a second memory unit each having a plurality of memory cells;
   a plurality of first memory elements and second memory elements, which store address information of memory cells to be relieved in said first memory unit and have element structures different from one another;
   a plurality of first comparators which compare the address information stored in said first memory elements with signal information on an address signal wiring;
   a plurality of second comparators which compare the address information stored in said second memory elements and the signal information on the address signal wiring; and
   a relief control circuit which controls switching from an access to said first memory unit to an access to said second memory unit according to the coincidence between the results of comparisons between said first and second comparators,
   wherein said plurality of first memory elements and first comparators are formed in a first area along the address signal wiring, and said plurality of second memory elements and second comparators are formed in a second area adjacent to the first area.

2. The semiconductor device according to claim 1, wherein said first comparators and said second comparators share the use of the address signal wiring.

3. The semiconductor device according to claim 2, wherein said address signal wiring linearly crosses a portion where said first and second areas are adjacent to each other.

4. The semiconductor device according to claim 1, wherein said first memory elements are cutoff type fuses which store information according to the presence or absence of cutoff, and said second memory elements are electrically programmable non-volatile memory elements which store information according to a difference in threshold voltage.

5. The semiconductor device according to claim 4, further including a first memory array unit and a second memory array unit respectively having the first memory unit and the second memory unit, and wherein said first memory array unit and said second memory array unit are disposed on both sides with the first area and the second area interposed therebetween, the first memory elements inherent in respective sides of the first and second memory array units on both sides are disposed so as to be spaced in three stages in the first area, and the second memory elements inherent in respective sides of the first and second memory array units on both sides are disposed so as to be spaced in two stages in the second area.

6. The semiconductor device according to claim 4, further including a circuit which generates a program voltage used for a program of said each second memory element, and wherein said each second memory element is provided so as to be closer to said program voltage generating circuit than said each first memory element.

7. The semiconductor device according to claim 4, wherein the number of said first memory elements is greater than that of said second memory elements, and the number of addresses storable by said first and second memory elements is set larger than an upper limit of the number of relief addresses relievable by said second memory array unit, and further including means which selects the result of comparisons by some first comparators and the result of comparisons by some second comparators.

8. The semiconductor device according to claim 7, wherein the number of the addresses storable by said first memory elements is equal to the upper limit of the number of the relief addresses relievable by said second memory array unit.

9. The semiconductor device according to claim 4, wherein said each second memory element includes,
   a non-volatile storage transistor element having a first source electrode, a first drain electrode, a floating gate electrode, and a control gate electrode and capable of having different threshold voltages,
   a read transistor element having a second source electrode and a second drain electrode, having the floating gate electrode as a gate electrode, and capable of having mutual conductances different according to the threshold voltages held by said non-volatile storage transistor element, and
   means which transfers a signal generated according to the mutual conductance of said read transistor element.

10. The semiconductor device according to claim 9, wherein said non-volatile storage transistor element has a MIS capacitive element provided with a capacitive electrode on a first semiconductor region through a insulating layer, said capacitive electrode functioning as a control gate electrode, and a MIS transistor having a first source electrode, a first drain electrode and a gate electrode formed in a second semiconductor region, and said capacitive electrode is commonly connected to said each gate electrode so as to serve as a floating gate electrode.

11. A semiconductor device comprising:
    a memory cell array having a plurality of memory cells;
    a first relief address storage circuit including a plurality of first memory elements each of which stores address information of a memory cell to be relieved in the memory cells;
    a second relief address storage circuit including a plurality of second memory elements each of which stores address information of a memory cell to be relieved in the memory cells; and
    an address signal wiring which commonly transmits address information to be compared with respective memory address information stored in said first relief address storage circuit and said second relief address storage circuit;
    wherein said first memory element and said second memory element have element structures different from each other, said first relief address storage circuit is formed in a first area along the address signal wring, and said second relief address storage circuit is formed in a second area adjacent to the first area.

12. A semiconductor device comprising:
    a memory cell array having a plurality of memory cells, some of which are used as redundant memory cells substituted for other memory cells;

a first relief address storage circuit including a plurality of first memory elements each of which stores address information of a memory cell to be relieved by said each redundant memory cell, and a plurality of first comparators;

a second relief address storage circuit including a plurality of second memory elements each of which stores address information of a memory cell to be relieved by said each redundant memory cell, and a plurality of second comparators;

an address signal wiring which commonly transmits address information to be compared with respective memory address information stored in said first relief address storage circuit and said second relief address storage circuit; and a selector circuit which selects either a first select signal or a second select signal to thereby set the selected signal as a signal for providing instructions for selecting said each redundant memory cell, wherein said each first memory element and said each second memory element have element structures different from each other, said first comparator outputs the first select signal when the address information stored in said each first storage element and signal information on said address signal wiring are found to coincide with each other from the result of comparison therebetween, and said second comparator outputs the second select signal when the address information stored in said each second storage element and signal information on said address signal wiring are found to coincide with each other from the result of comparison therebetween.

13. The semiconductor device according to claim 12, wherein said first relief address storage circuit is formed in a first area along the address signal wiring, and said second relief address storage circuit is formed in a second area adjacent to the first area.

* * * * *